US009048360B2

(12) United States Patent
Tsunemi et al.

(10) Patent No.: US 9,048,360 B2
(45) Date of Patent: Jun. 2, 2015

(54) SOLAR CELL, SOLAR CELL WITH INTERCONNECTION SHEET ATTACHED AND SOLAR CELL MODULE

(75) Inventors: Akiko Tsunemi, Osaka (JP); Yasushi Sainoo, Osaka (JP); Tomohiro Nishina, Osaka (JP)

(73) Assignee: Sharp Kabushiki Kaisha, Osaka-shi, Osaka (JP)

( * ) Notice: Subject to any disclaimer, the term of this patent is extended or adjusted under 35 U.S.C. 154(b) by 779 days.

(21) Appl. No.: 13/379,154

(22) PCT Filed: Jun. 21, 2010

(86) PCT No.: PCT/JP2010/060480
§ 371 (c)(1),
(2), (4) Date: Dec. 19, 2011

(87) PCT Pub. No.: WO2010/150749
PCT Pub. Date: Dec. 29, 2010

(65) Prior Publication Data
US 2012/0097241 A1   Apr. 26, 2012

(30) Foreign Application Priority Data
Jun. 22, 2009 (JP) ................................. 2009-147903

(51) Int. Cl.
H01L 31/02 (2006.01)
H01L 31/05 (2014.01)
H01L 31/0216 (2014.01)
H01L 31/0224 (2006.01)

(52) U.S. Cl.
CPC ...... *H01L 31/0516* (2013.01); *H01L 31/02167* (2013.01); *H01L 31/022441* (2013.01); *Y02E 10/50* (2013.01)

(58) Field of Classification Search
CPC ................................. H01L 31/02; H01L 31/05
USPC ................................................... 136/252, 256
See application file for complete search history.

(56) References Cited

U.S. PATENT DOCUMENTS

| 5,681,402 A | 10/1997 | Ichinose et al. |
| 2002/0148499 A1 | 10/2002 | Tanaka |
| 2005/0082655 A1 | 4/2005 | Nishi et al. |
| 2008/0017982 A1* | 1/2008 | Nakatani ........................ 257/737 |
| 2010/0018565 A1 | 1/2010 | Funakoshi |

FOREIGN PATENT DOCUMENTS

| CN | 1662118 A | 8/2005 |
| JP | 8-236796 | 9/1996 |
| JP | 2000-277768 | 10/2000 |

(Continued)

OTHER PUBLICATIONS

International Search Report for PCT/JP2010/060480 mailed Sep. 21, 2010.

*Primary Examiner* — Susan D Leong
(74) *Attorney, Agent, or Firm* — Nixon & Vanderhye, P.C.

(57) ABSTRACT

Disclosed are a solar cell, a solar cell with interconnection sheet attached, and a solar cell module wherein a surface of an electrode for first conductive type is covered with a migration suppressing layer for preventing a metal forming electrode for first conductive type from precipitating, and at least one of a surface of migration suppressing layer covering electrode for first conductive type and a surface of electrode for second conductive type is covered with an insulating member.

11 Claims, 11 Drawing Sheets

(56) References Cited

FOREIGN PATENT DOCUMENTS

| JP | 2002-217434 | 8/2002 |
| JP | 2003-124482 | 4/2003 |
| JP | 2005-129660 | 5/2005 |
| JP | 2005-175436 | 6/2005 |
| JP | 2005-310830 | 11/2005 |
| WO | WO 2008/090718 | 7/2008 |
| WO | WO 2009/041212 | 4/2009 |

* cited by examiner (a)

(b)

SOLAR CELL, SOLAR CELL WITH INTERCONNECTION SHEET ATTACHED AND SOLAR CELL MODULE

This application is the U.S. national phase of International Application No. PCT/JP2010/060480 filed 21 Jun. 2010 which designated the U.S. and claims priority to JP 2009-147903 filed 22 Jun. 2009, the entire contents of each of which are hereby incorporated by reference.

TECHNICAL FIELD

The present invention relates to a solar cell, a solar cell with interconnection sheet attached and a solar cell module.

BACKGROUND ART

In recent years, particularly from the view point of protection of the earth environment, expectation for solar cells that convert sunlight energy into electric energy as a next-generation energy source has been rapidly increased. While various types of solar cells including those using a compound semiconductor and those using an organic material are known, solar cells using silicon crystals are the current mainstream.

The solar cells that are most widely produced and on the market at present have such a structure that an n electrode is formed on the surface where the sunlight enters (light-receiving surface), and a p electrode is formed on the surface opposite to the light-receiving surface (back surface).

For example, Patent Literature 1 (Japanese Patent Laying-Open No. 2005-310830) discloses a back electrode type solar cell wherein an n electrode and a p electrode are formed only on the back surface of the solar cell while no electrode is formed on the light-receiving surface of the solar cell.

CITATION LIST

Patent Literature

PTL 1: Japanese Patent Laying-Open No. 2005-310830

SUMMARY OF INVENTION

Technical Problem

By the foregoing back electrode type solar cell having the constitution as disclosed in Patent Literature 1 alone, available electric energy is limited. For this reason, a method of electrically connecting a plurality of back electrode type solar cells of the above constitution to form a solar cell module is considered.

Here, as a method of electrically connecting a plurality of back electrode type solar cells to form a solar cell module, there is proposed a method of making a solar cell module by sealing solar cells with interconnection sheet attached having a back electrode type solar cell disposed on an interconnection sheet, in a sealant.

In the following, referring to schematic sectional views of FIG. 12(a) and FIG. 12(b), one example of the aforementioned method of fabricating a solar cell module by sealing the solar cells with interconnection sheet attached in a sealant will be described.

First, as shown in FIG. 12(a), a solar cell with interconnection sheet attached is fabricated by making a back electrode type solar cell 80 and an interconnection sheet 100 adhere with each other by an insulating adhesive 116.

Here, in a solar cell with interconnection sheet attached, an electrode for first conductive type 6 that contacts a first conductive type impurity diffusion area 2 on the back surface of a semiconductor substrate 1 of back electrode type solar cell 80 is disposed on a wiring for first conductive type 12 formed on an insulating base material 11 of interconnection sheet 100, and an electrode for second conductive type 7 that contacts a second conductive type impurity diffusion area 3 on the back surface of semiconductor substrate 1 of back electrode type solar cell 80 is disposed on a wiring for second conductive type 13 formed on insulating base material 11 of interconnection sheet 100.

Here, a light-receiving surface of semiconductor substrate 1 of back electrode type solar cell 80 is formed with a texture structure, and an antireflection film 5 is formed on the texture structure. Here, on the back surface of semiconductor substrate 1 of back electrode type solar cell 80, a passivation film 4 is formed.

Next, as shown in FIG. 12(b), the solar cell with interconnection sheet attached that is fabricated in the manner as described above is sandwiched between a transparent substrate 17 implemented, for example, by a glass substrate having a sealant 18 such as ethylene vinyl acetate, and a back film 19 such as a polyester film having sealant 18, and back electrode type solar cell 80 forming the solar cell with interconnection sheet attached is sealed in sealant 18, and thereby a solar cell module is fabricated.

According to the above method, a plurality of back electrode type solar cells 80 can be electrically connected only by disposing back electrode type solar cell 80 on interconnection sheet 100, so that a solar cell module can be produced more efficiently.

In the solar cell module produced in the manner as described above, there is sometimes the case that potential differences arises between electrodes and between wirings of different conductive types during use of the solar cell module, and a migration (ion migration) phenomenon occurs by an electric field caused by the potential differences.

In the aforementioned solar cell module, since the distance between neighboring electrode for first conductive type 6 and electrode for second conductive type 7 and the distance between neighboring wiring for first conductive type 12 and wiring for second conductive type 13 are short, the metal that forms the electrodes or the wirings precipitates between neighboring electrode for first conductive type 6 and electrode for second conductive type 7, and between neighboring wiring for first conductive type 12 and wiring for second conductive type 13, and then moves to lower the insulation resistance, which may deteriorate characteristics of the solar cell module. Hence, amelioration of this is desired.

In consideration of the above circumstances, it is an object of the present invention to provide a solar cell, a solar cell with interconnection sheet attached and a solar cell module capable of preventing characteristics of the solar cell module from deteriorating.

Solution to Problem

The present invention relates to a solar cell including: a semiconductor substrate; a first conductive type impurity diffusion area and a second conductive type impurity diffusion area formed on one surface side of the semiconductor substrate; an electrode for first conductive type disposed on the first conductive type impurity diffusion area; and an electrode for second conductive type disposed on the second conductive type impurity diffusion area, wherein a surface of the electrode for first conductive type is covered with a migration suppressing layer for preventing a metal forming the electrode for first conductive type from precipitating, and at least one of a surface of the migration suppressing layer covering the electrode for first conductive type and a surface of the electrode for second conductive type is covered with an insulating member.

In this case, in the solar cell according to the present invention, each of the migration suppressing layer and the insulating member is disposed to traverse a straight line connecting neighboring the electrode for first conductive type and the electrode for second conductive type.

Further, the present invention relates to a solar cell with interconnection sheet attached including: a solar cell; and an interconnection sheet, wherein the solar cell has a semiconductor substrate, a first conductive type impurity diffusion area and a second conductive type impurity diffusion area formed on one a surface side of the semiconductor substrate, an electrode for first conductive type disposed on the first conductive type impurity diffusion area, and an electrode for second conductive type disposed on the second conductive type impurity diffusion area, the interconnection sheet has an insulating base material, a wiring for first conductive type and a wiring for second conductive type disposed on the insulating base material, the electrode for first conductive type of the solar cell is disposed to be electrically connected with the wiring for first conductive type of the interconnection sheet, the electrode for second conductive type of the solar cell is disposed to be electrically connected with the wiring for second conductive type of the interconnection sheet, a surface of the electrode for first conductive type is covered with a migration suppressing layer for preventing a metal forming the electrode for first conductive type from precipitating, and at least a part of a surface of the solar cell between neighboring the electrode for first conductive type and the electrode for second conductive type, and at least a part of a surface of the insulating base material between neighboring the wiring for first conductive type and the wiring for second conductive type are joined by an insulating member.

In this case, in the solar cell with interconnection sheet attached according to the present invention, each of the migration suppressing layer and the insulating member is disposed to traverse the straight line connecting neighboring the electrode for first conductive type and the electrode for second conductive type.

Further, the present invention relates to a solar cell with interconnection sheet attached including: a solar cell; and an interconnection sheet, wherein the solar cell has a semiconductor substrate, a first conductive type impurity diffusion area and a second conductive type impurity diffusion area formed on one surface side of the semiconductor substrate, an electrode for first conductive type disposed on the first conductive type impurity diffusion area, and an electrode for second conductive type disposed on the second conductive type impurity diffusion area, the interconnection sheet has an insulating base material, a wiring for first conductive type and a wiring for second conductive type disposed on the insulating base material, the electrode for first conductive type of the solar cell is disposed to be electrically connected with the wiring for first conductive type of the interconnection sheet, the electrode for second conductive type of the solar cell is disposed to be electrically connected with the wiring for second conductive type of the interconnection sheet, a surface of the wiring for first conductive type is covered with a migration suppressing layer for preventing metal forming the wiring for first conductive type from precipitating, and at least a part of a surface of the solar cell between neighboring the electrode for first conductive type and the electrode for second conductive type, and at least a part of a surface of the insulating base material between neighboring the wiring for first conductive type and the wiring for second conductive type are joined by an insulating member.

In this case, in the solar cell with interconnection sheet attached according to the present invention, each of the migration suppressing layer and the insulating member is disposed to traverse the straight line connecting neighboring the wiring for first conductive type and the wiring for second conductive type.

Further, the present invention relates to a solar cell module including the solar cell of the solar cell with interconnection sheet attached according to any of the above descriptions sealed in a sealant.

Advantageous Effects of Invention

According to the present invention, it is possible to provide a solar cell, a solar cell with interconnection sheet attached and a solar cell module capable of preventing characteristics of the solar cell module from deteriorating.

DESCRIPTION OF EMBODIMENTS

Figure 1:
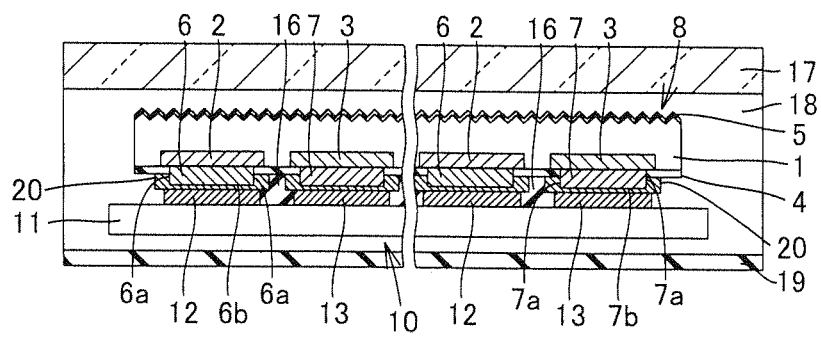
FIG. 1 is a schematic sectional view of one example of a solar cell module of the present invention.

In the following, embodiments of the present invention will be described. In the drawings of the present invention, the same reference numeral denotes an equivalent part or a corresponding part.

Embodiment 1

FIG. 1 is a schematic sectional view of one example of a solar cell module of the present invention. In the solar cell module having a constitution as shown in FIG. 1, a solar cell with interconnection sheet attached having a back electrode type solar cell 8 disposed on an interconnection sheet 10 is sealed in a sealant 18 such as ethylene vinyl acetate between a transparent substrate 17 such as a glass plate and a back film 19 such as a polyester film.

Here, back electrode type solar cell 8 includes a semiconductor substrate 1, a first conductive type impurity diffusion area 2 and a second conductive type impurity diffusion area 3 foamed on the back surface of semiconductor substrate 1, an electrode for first conductive type 6 formed in contact with first conductive type impurity diffusion area 2, and an electrode for second conductive type 7 formed in contact with second conductive type impurity diffusion area 3.

A light-receiving surface of semiconductor substrate 1 of back electrode type solar cell 8 is formed with a concavo-convex structure such as a texture structure, and an antireflection film 5 is formed to cover the concavo-convex structure. A back surface of semiconductor substrate 1 of back electrode type solar cell 8 is formed with a passivation film 4.

Also a migration suppressing layer 20 is formed to cover the surface (lateral wall 6a and bottom face 6b) of electrode for first conductive type 6 on the back surface of back electrode type solar cell 8, and migration suppressing layer 20 is formed to cover the surface (lateral wall 7a and bottom face 7b) of electrode for second conductive type 7.

In this example, first conductive type impurity diffusion area 2 and second conductive type impurity diffusion area 3 are formed into strip shapes, respectively extending on the front surface side and/or back surface side of the paper plane of FIG. 1, and first conductive type impurity diffusion area 2 and second conductive type impurity diffusion area 3 are arranged alternately at a predetermined interval on the back surface of semiconductor substrate 1.

In this example, also electrode for first conductive type 6 and electrode for second conductive type 7 are formed into strip shapes, respectively extending on the front surface side and/or back surface side of the paper plane of FIG. 1, and electrode for first conductive type 6 and electrode for second conductive type 7 are formed respectively in contact with first conductive type impurity diffusion area 2 and second conductive type impurity diffusion area 3 along first conductive type impurity diffusion area 2 and second conductive type impurity diffusion area 3 on the back surface of semiconductor substrate 1 through an opening provided in passivation film 4.

On the other hand, interconnection sheet 10 includes an insulating base material 11, a wiring for first conductive type 12 and a wiring for second conductive type 13 formed into predetermined shapes on the surface of insulating base material 11.

Wiring for first conductive type 12 on insulating base material 11 of interconnection sheet 10 is formed into a shape that mutually faces electrode for first conductive type 6 on the back surface of back electrode type solar cell 8 one by one.

Wiring for second conductive type 13 on insulating base material 11 of interconnection sheet 10 is formed into a shape that mutually faces electrode for second conductive type 7 on the back surface of back electrode type solar cell 8 one by one.

In this example, also wiring for first conductive type 12 and wiring for second conductive type 13 are formed into strip shapes, respectively extending on the front surface side and/or back surface side of the paper plane of FIG. 1.

Then, by adhesion of back electrode type solar cell 8 and interconnection sheet 10 by insulating member 16, a solar cell with interconnection sheet attached is formed.

Here, in the solar cell with interconnection sheet attached, electrode for first conductive type 6 of back electrode type solar cell 8 is disposed so that it is electrically connected with wiring for first conductive type 12 of interconnection sheet 10 with migration suppressing layer 20 interposed therebetween, and electrode for second conductive type 7 of back electrode type solar cell 8 is electrically connected with wiring for second conductive type 13 of interconnection sheet 10 with migration suppressing layer 20 interposed therebetween.

At least part of the back surface of back electrode type solar cell 8 between neighboring electrode for first conductive type 6 and electrode for second conductive type 7, and at least part of the surface of insulating base material 11 between neighboring wiring for first conductive type 12 and wiring for second conductive type 13 are joined by insulating member 16.

In the following, one example of a production method of a solar cell module having a configuration shown in FIG. 1 will be described. In the following, after describing a method of forming back electrode type solar cell 8 first, a method of forming interconnection sheet 10 will be described, and subsequently, a method of forming a solar cell with interconnection sheet attached by adhesion between back electrode type solar cell 8 and interconnection sheet 10, and lastly, a method of forming a solar cell module will be described. In the present invention, the order of forming back electrode type solar cell 8 and interconnection sheet 10 is not particularly limited.

Figure 2:
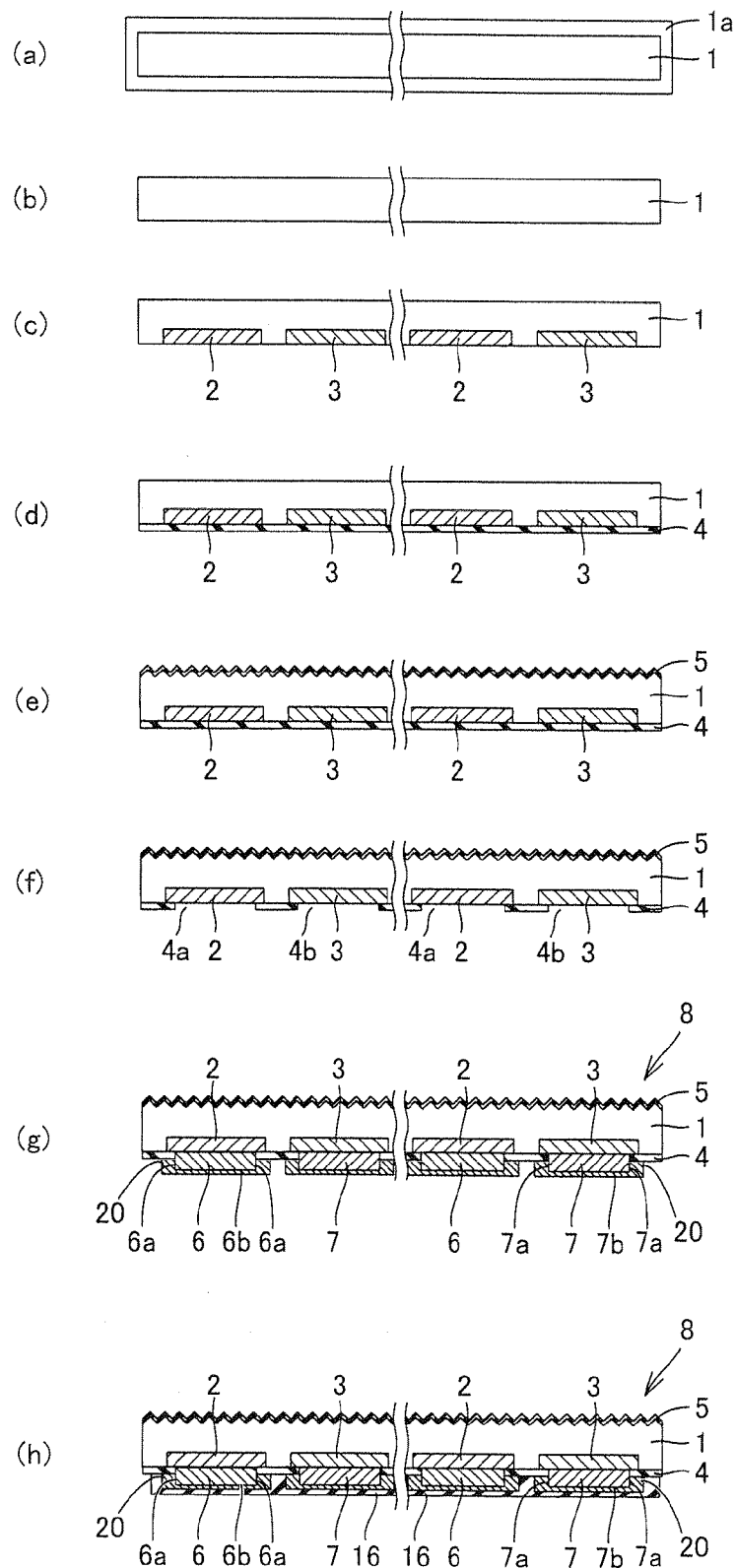
FIGS. 2(a) to 2(h) are schematic sectional views illustrating one example of a production method of a back electrode type solar cell used in a solar cell module of the present invention.

First, as shown in a schematic sectional view of FIG. 2(a), semiconductor substrate 1 having a slice damage 1a formed on the surface of semiconductor substrate 1 is prepared, for example, by slicing from an ingot. Here, as semiconductor substrate 1, for example, a silicon substrate formed, for example, of polycrystalline silicon or monocrystalline silicon of either n conductive type or p conductive type may be used.

Next, as shown in a schematic sectional view of FIG. 2(b), slice damage 1a on the surface of semiconductor substrate 1 is removed. Removal of slice damage 1a may be achieved, for example, by etching the surface of the silicon substrate after slicing with mixed acid of a hydrogen fluoride aqueous solution and nitric acid or an alkaline aqueous solution such as sodium hydroxide, when semiconductor substrate 1 is formed from the aforementioned silicon substrate.

Here, while the size and the shape of semiconductor substrate 1 after removal of slice damage 1a are not particularly limited, thickness of semiconductor substrate 1 may be, for example, 50 μm or more, and 400 μm or less, and particularly preferably about 160 μm.

Next, as shown in a schematic sectional view of FIG. 2(c), first conductive type impurity diffusion area 2 and second conductive type impurity diffusion area 3 are respectively formed on the back surface of semiconductor substrate 1. Here, first conductive type impurity diffusion area 2 may be foamed, for example, by a gas-phase diffusion using gas containing first conductive type impurities, and second conductive type impurity diffusion area 3 may be formed, for example, by a gas-phase diffusion using gas containing second conductive type impurities.

Here, first conductive type impurity diffusion area 2 is not particularly limited insofar as it is an area containing first conductive type impurities, and exhibiting either an n conductive type or a p conductive type. As the first conductive type impurities, when the first conductive type is an n type, n type impurities such as phosphorous, for example, may be used, whereas when the first conductive type is a p type, p type impurities such as boron or aluminum, for example, may be used.

Impurity diffusion area for second conductive type 3 is not particularly limited insofar as it is an area containing second conductive type impurities and exhibiting a conductive type opposite to that of first conductive type impurity diffusion area 2. Here, as the second conductive type impurities, when the second conductive type is an n type, n type impurities such as phosphorous, for example, may be used, whereas when the second conductive type is a p type, p type impurities such as boron or aluminum, for example, may be used.

The first conductive type may be either an n conductive type or a p conductive type, and the second conductive type may be a conductive type opposite to the first conductive type. That is, when the first conductive type is an n type, the second conductive type is a p type, and when the first conductive type is a p type, the second conductive type is an n type.

As the gas containing first conductive type impurities, when the first conductive type is an n type, gas containing n-type impurities such as phosphorous, for example, $POCl_3$ may be used, and when the first conductive type is a p type, gas containing p-type impurities such as boron, for example, $BBr_3$ may be used.

As the gas containing second conductive type impurities, when the second conductive type is an n type, gas containing n-type impurities such as phosphorous, for example, $POCl_3$ may be used, and when the second conductive type is a p type, gas containing p-type impurities such as boron, for example, $BBr_3$ may be used.

Next, as shown in a schematic sectional view of FIG. 2(d), passivation film 4 is formed on the back surface of semiconductor substrate 1. Here, passivation film 4 may be formed by a thermal oxidation method or a plasma CVD (Chemical Vapor Deposition) method.

Here, as passivation film 4, for example, a silicon oxide film, a silicon nitride film, or a stack of a silicon oxide film and a silicon nitride film may be used, however, any film that is stable as an insulating substance may be used without limited to these.

Thickness of passivation film 4 may be, for example, 0.05 μm or more and 1 μm or less, and particularly preferably about 0.2 μm.

Next, as shown in a schematic sectional view of FIG. 2(e), after forming a concavo-convex structure such as a texture structure on the entire surface of the light-receiving surface of semiconductor substrate 1, antireflection film 5 is formed on the concavo-convex structure.

Here, the texture structure may be formed, for example, by etching the light-receiving surface of semiconductor substrate 1. For example, when semiconductor substrate 1 is a silicon substrate, the texture structure may be formed by etching the light-receiving surface of semiconductor substrate 1 using an etching solution heated to a temperature of 70° C. or more and 80° C. or less, prepared, for example, by adding isopropyl alcohol to an alkaline aqueous solution of sodium hydroxide or potassium hydroxide.

Antireflection film 5 may be formed, for example, by a plasma CVD method. As antireflection film 5, for example, a silicon nitride film may be used without limitation.

Next, as shown in a schematic sectional view of FIG. 2(f), by removing a part of passivation film 4 of the back surface of semiconductor substrate 1, a contact hole 4a and a contact hole 4b are formed. Here, contact hole 4a is formed to expose at least part of the surface of first conductive type impurity diffusion area 2, and contact hole 4b is formed to expose at least part of the surface of second conductive type impurity diffusion area 3.

Each of contact hole 4a and contact hole 4b may be formed, for example, by a method of forming a resist pattern having openings in the parts corresponding to the sites where contact hole 4a and contact hole 4b are to be formed, on passivation film 4 using a photolithography technique, and then removing passivation film 4 through the openings of the resist pattern by etching or the like, or a method of applying an etching paste on parts of passivation film 4 corresponding to the sites where contact hole 4a and contact hole 4b are to be formed, followed by heating to remove passivation film 4 by etching.

Next, as shown in a schematic sectional view of FIG. 2(g), after forming electrode for first conductive type 6 that contacts first conductive type impurity diffusion area 2 through contact hole 4a, and electrode for second conductive type 7 that contacts second conductive type impurity diffusion area 3 through contact hole 4b, migration suppressing layer 20 is formed to cover the surface (lateral wall 6a and bottom face 6b) of electrode for first conductive type 6 on the back surface of back electrode type solar cell 8, and migration suppressing layer 20 is formed to cover the surface (lateral wall 7a and bottom face 7b) of electrode for second conductive type 7.

Then as shown in a schematic sectional view of FIG. 2(h), by disposing insulating member 16 to cover migration suppressing layer 20 covering the surfaces of electrode for first conductive type 6 and electrode for second conductive type 7, back electrode type solar cell 8 is fabricated.

When back electrode type solar cell 8 is connected with interconnection sheet 10 as will be described later, insulating member 16 shown in FIG. 2(h) may not be formed, or alternatively, insulating member 16 may be formed only on the surface of passivation film 4 between neighboring electrode for first conductive type 6 and electrode for second conductive type 7. In these cases, it is possible to prevent insulating member 16 from entering between an electrode and a wiring to inhibit electric connection, in electrically connecting electrode for first conductive type 6 of back electrode type solar cell 8 and wiring for first conductive type 12 of interconnection sheet 10, or in electrically connecting electrode for second conductive type 7 of back electrode type solar cell 8 and wiring for second conductive type 13 of interconnection sheet 10.

Here, as electrode for first conductive type 6 and electrode for second conductive type 7, electrodes made of a metal such as silver may be used, however, the metal is not particularly limited to silver.

As migration suppressing layer 20, a layer capable of preventing precipitation of a metal that forms electrode for first conductive type 6 and/or a metal that forms electrode for second conductive type 7 may be used, and for example, a layer formed of an oxide, a compound or an alloy containing at least one kind of a metal selected from the group consisting of tin, palladium, gold, platinum, chromium, iron, nickel and lead may be used. Migration suppressing layer 20 may be a monolayer or may be made up of a plurality of layers.

Migration suppressing layer 20 may be formed by firing after applying a conventionally known cream solder by a method such as screen printing, dispenser application or ink-jet application.

Height of each of electrode for first conductive type 6 and electrode for second conductive type 7 may be, for example, 5 μm or more and 50 μm or less, and particularly preferably about 15 μm.

FIG. 3(a) is a schematic plan view of one example of the back surface of back electrode type solar cell 8 fabricated in the manner as described above is shown. Here, on the back surface of back electrode type solar cell 8, each of electrode for first conductive type 6 and electrode for second conductive type 7 is formed into a strip shape, and a strip of electrode for first conductive type 6 and a strip of electrode for second conductive type 7 are arranged alternately one and one at an interval. Each of the lateral wall and the bottom face of electrode for first conductive type 6, and each of the lateral wall and the bottom face of electrode for second conductive type 7 are covered with migration suppressing layer 20. Then, insulating member 16 is disposed to cover the entire back surface of back electrode type solar cell 8.

Figure 3:
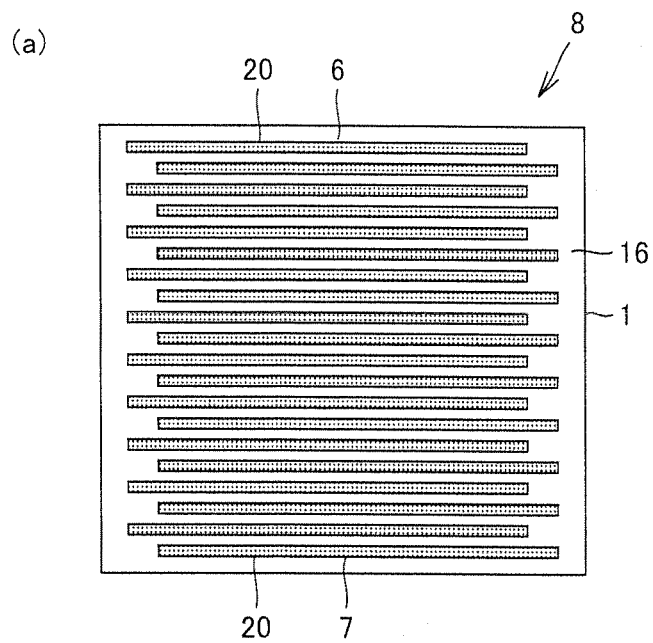
FIGS. 3(a) and 3(b) are schematic plan views of one example of the back surface of a back electrode type solar cell used in a solar cell module of the present invention.
Figure 3:
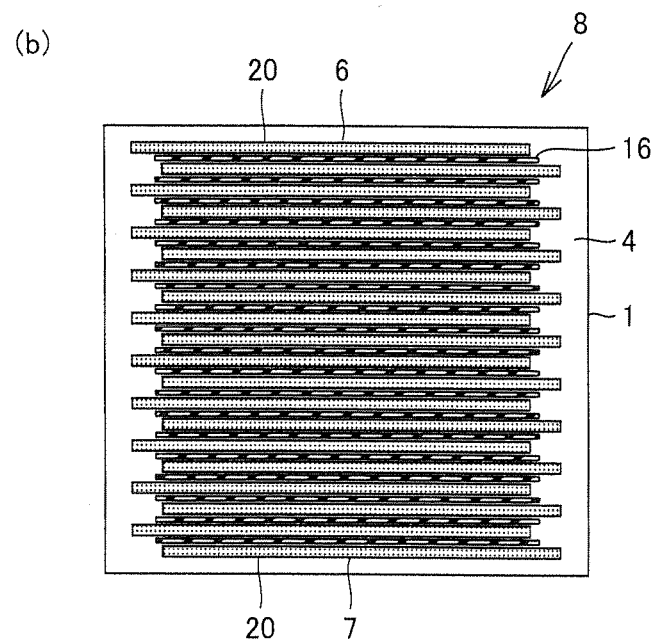

For example, in FIG. 3(*a*), when electric power from back electrode type solar cell 8 is derived from the left end of electrode for first conductive type 6 and the right end of electrode for second conductive type 7 rather than from the entire bottom face 6*b* of electrode for first conductive type 6 or from the entire bottom face 7*b* of electrode for second conductive type 7, insulating member 16 may be once disposed on the entire back surface of back electrode type solar cell 8, and then insulating member 16 positioned in a site where electric power is derived may be removed, to enable electric connection with the electrode.

FIG. 3(*b*) is a schematic plan view of another example of the back surface of back electrode type solar cell 8. As shown in FIG. 3(*b*), insulating member 16 may be formed on the surface of passivation film 4 between neighboring electrode for first conductive type 6 and electrode for second conductive type 7. In this case, since insulating member 16 is not disposed on bottom face 6*b* of electrode for first conductive type 6 and bottom face 7*b* of electrode for second conductive type 7, electric connection via bottom face 6*b* of electrode for first conductive type 6 and via bottom face 7*b* of electrode for second conductive type 7 is not prevented, and it is possible to derive electric power from back electrode type solar cell 8, from nearly the entire bottom face 6*b* of electrode for first conductive type 6 or nearly the entire bottom face 7*b* of electrode for second conductive type 7.

In both cases of FIG. 3(*a*) and FIG. 3(*b*), it is preferred that insulating member 16 closely adheres to at least a part of the back surface of back electrode type solar cell 8 between neighboring electrode for first conductive type 6 and electrode for second conductive type 7, and that insulating member 16 is disposed on the straight line connecting neighboring electrode for first conductive type 6 and electrode for second conductive type 7. Migration is a phenomenon that a metal precipitates and moves along the electric field occurring on the straight line connecting neighboring electrode for first conductive type 6 and electrode for second conductive type 7. Therefore, by disposing insulating member 16 on the straight line connecting neighboring electrode for first conductive type 6 and electrode for second conductive type 7, it is possible to prevent the metal precipitated from these electrodes from moving.

When insulating member 16 can be made into a highly fluid state such as liquid state, electric power generated in back electrode type solar cell 8 may be derived from nearly the entire bottom face 6*b* of electrode for first conductive type 6 and nearly the entire bottom face 7*b* of electrode for second conductive type 7, as shown in FIG. 3(*a*). In other words, the site where insulating member 16 is disposed is not limited as long as insulating member 16 closely adheres to at least a part of the back surface of back electrode type solar cell 8 between neighboring electrode for first conductive type 6 and electrode for second conductive type 7, and electric power can be derived from electrode for first conductive type 6 and electrode for second conductive type 7.

Interconnection sheet 10 may be fabricated, for example, in the following manner. First, as shown in a schematic sectional view of FIG. 4(*a*), a conductive layer 41 is formed on the surface of insulating base material 11. Here, as insulating base material 11, for example, a substrate formed of resin such as polyester, polyethylene naphtharate or polyimide may be used, without limitation. Thickness of insulating base material 11 may be, for example, 10 μm or more and 200 μm or less, and particularly preferably about 25 μm.

As conductive 41, for example, a layer of a metal such as copper may be used without limitation.

Figure 4:
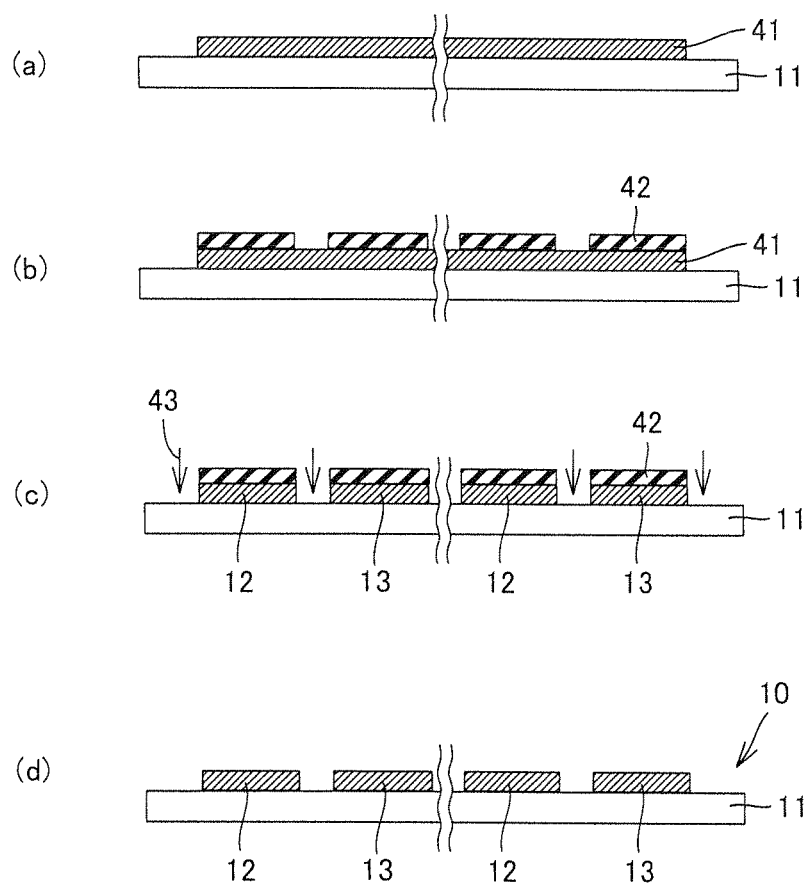
FIGS. 4(a) to 4(d) are schematic sectional views illustrating one example of a production method of an interconnection sheet used in a solar cell module of the present invention.

Next, as shown in a schematic sectional view of FIG. 4(*b*), a resist pattern 42 is formed on conductive layer 41 on the surface of insulating base material 11. Here, resist pattern 42 is formed into a shape having an opening in the site other than the sites where wiring for first conductive type 12 and wiring for second conductive type 13 are formed. As the resist that forms resist pattern 42, for example, a conventionally known one may be used, and applied by a method such as screen printing, dispenser application or inkjet application.

Next, as shown in a schematic sectional view of FIG. 4(*c*), by removing conductive layer 41 in the site exposed from resist pattern 42 in the direction of an arrow 43, conductive layer 41 is patterned, and wiring for first conductive type 12 and wiring for second conductive type 13 are formed from the remainder of conductive layer 41.

Here, removal of conductive layer 41 may be achieved, for example, by wet etching using an acid or alkaline solution without limitation. Width of wiring for first conductive type 12 and wiring for second conductive type 13 may be, for example, but not limited to 300 μm or more and 1 mm or less, and particularly preferably about 500 μm.

Next, as shown in a schematic sectional view of FIG. 4(*d*), by removing all of resist pattern 42 from the surface of wiring for first conductive type 12 and the surface of wiring for second conductive type 13, interconnection sheet 10 is fabricated.

Figure 5:
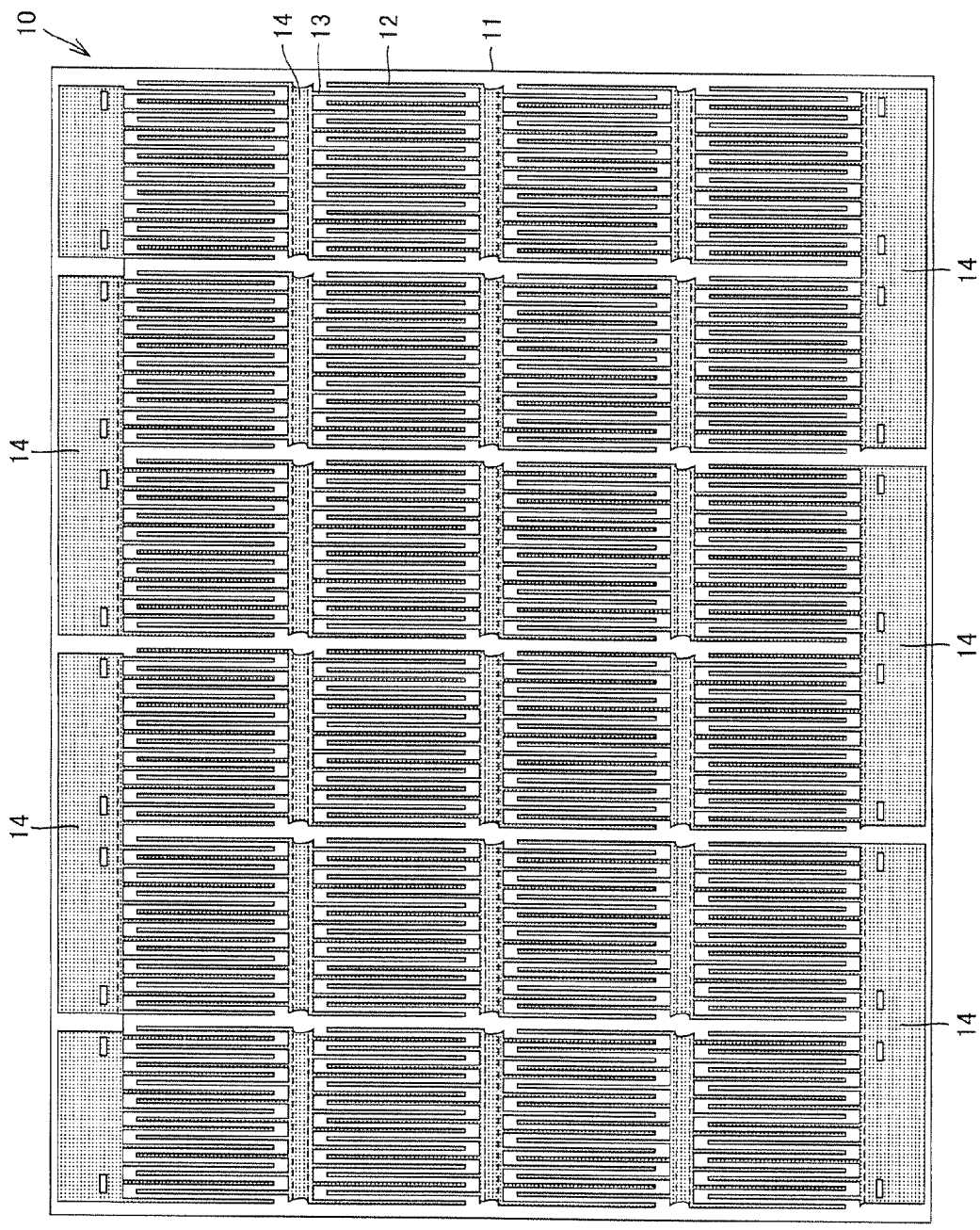
FIG. 5 is a schematic plan view of one example of an interconnection sheet used in a solar cell module of the present invention.

FIG. 5 is a schematic plan view of one example of the surface of interconnection sheet 10 fabricated as described above. Here, on the surface of insulating substrate 11 of interconnection sheet 10, each of wiring for first conductive type 12 and wiring for second conductive type 13 is formed into a strip shape. On the surface of insulating base material 11 of interconnection sheet 10, a strip-like wiring for connection 14 is formed, and by wiring for connection 14, wiring for first conductive type 12 and wiring for second conductive type 13 are electrically connected. Here, wiring for connection 14 may be formed, for example, from the remainder of conductive layer 41 similarly to wiring for first conductive type 12 and wiring for second conductive type 13.

Figure 6:
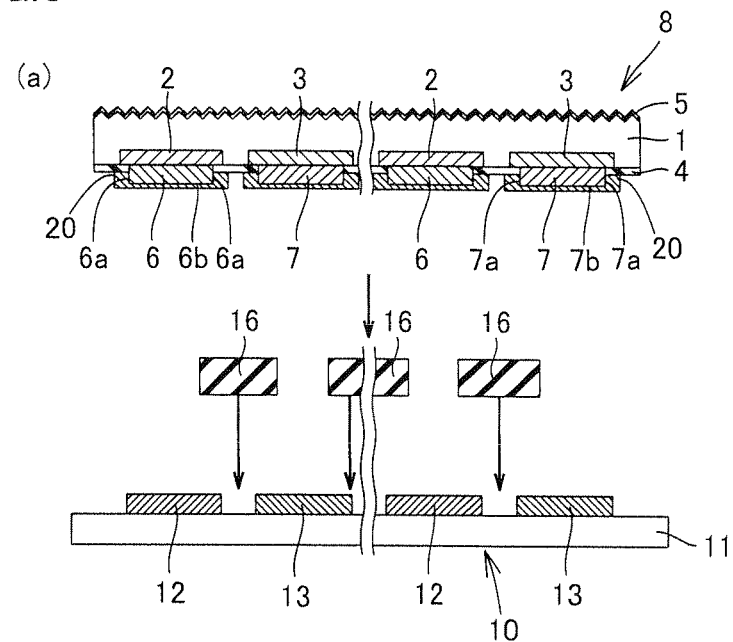
FIGS. 6(a) and 6(b) are schematic sectional views illustrating one example of a production method of a solar cell with interconnection sheet attached of the present invention.
Figure 6:
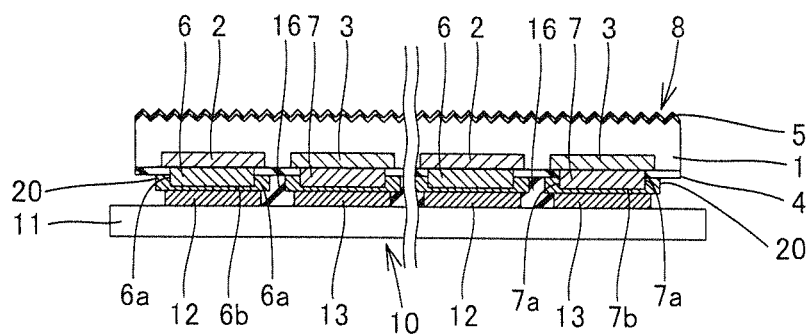

Thereafter, as shown in a schematic sectional view of FIG. 6(*a*), after applying insulating member 16 on the surface of interconnection sheet 10 fabricated in the manner as described above, electrode for first conductive type 6 of back electrode type solar cell 8 is disposed on wiring for first conductive type 12 of interconnection sheet 10, and electrode for second conductive type 7 of back electrode type solar cell 8 is disposed on wiring for second conductive type 13 of interconnection sheet 10. Here, insulating member 16 may be applied, for example, by a method such as screen printing, dispenser application or inkjet application.

Further, insulating member 16 is preferably an insulating adhesive material capable of closely achieving adhesion between at least a part of the back surface of back electrode type solar cell 8 between neighboring electrode for first conductive type 6 and electrode for second conductive type 7, and at least a part of the surface of insulating base material 11 between neighboring wiring for first conductive type 12 and wiring for second conductive type 13.

Thereafter, by making the insulating adhesive material which is insulating member 16 cure, for example, by a method such as heating or UV irradiation, as shown in a schematic sectional view of FIG. 6(*b*), a solar cell with interconnection sheet attached having such a constitution that back electrode type solar cell 8 and interconnection sheet 10 are adhered by insulating member 16 while electrode for first conductive type 6 of back electrode type solar cell 8 and wiring for first conductive type 12 of interconnection sheet 10 are electrically connected with migration suppressing layer 20 interposed therebetween, and electrode for second conductive type 7 of back electrode type solar cell 8 and wiring for second conductive type 13 of interconnection sheet 10 are electrically connected with migration suppressing layer 20 interposed therebetween is formed.

Here, at least a part of the back surface of back electrode type solar cell 8 between neighboring electrode for first conductive type 6 and electrode for second conductive type 7, and at least a part of the surface of insulating base material 11 between neighboring wiring for first conductive type 12 and wiring for second conductive type 13 are joined by insulating member 16.

Here, as insulating member 16, those having electric insulation property of such a degree that a current does not flow between neighboring electrodes or between neighboring wirings, and capable of bonding back electrode type solar cell 8 and interconnection sheet 10 may be used.

More specifically, an insulating adhesive material capable of adhering in close contact with an insulating substance such as passivation film 4 exposed from between neighboring electrode for first conductive type 6 and electrode for second conductive type 7, and with insulating base material 11 exposed from between neighboring wiring for first conductive type 12 and wiring for second conductive type 13 may be used as insulating member 16. Insulating member 16 preferably has such characteristics that the electric resistance is sufficiently high, the content of a component capable of binding with a metal ion is small, and there is little entry of water. Concretely, under filler resins (ThreeBond2202, product of ThreeBond) for sealing electronic components or chips to an interconnection substrate are preferred.

Thereafter, as shown in FIG. 1, by sealing the solar cell with interconnection sheet attached fabricated in the manner as described above in sealant 18 such as ethylene vinyl acetate between transparent substrate 17 such as a glass substrate and back film 19 such as a polyester film, one example of a solar cell module of the present invention is fabricated.

When the insulating adhesive material which is insulating member 16 is cured by heating, it may be cured concurrently with sealing back electrode type solar cell 8 in sealant 18.

As described above, in the solar cell module having a constitution shown in FIG. 1, migration suppressing layer 20 is formed to cover the surface (lateral wall 6*a* and bottom face 6*b*) of electrode for first conductive type 6 of the back surface of back electrode type solar cell 8, and migration suppressing layer 20 is formed to cover the surface (lateral wall 7*a* and bottom face 7*b*) of electrode for second conductive type 7. Then, at least a part of the back surface of back electrode type solar cell 8 between neighboring electrode for first conductive type 6 and electrode for second conductive type 7, and at least a part of the surface of insulating base material 11 between neighboring wiring for first conductive type 12 and wiring for second conductive type 13 are joined by insulating member 16.

Therefore, in the solar cell module having a constitution as shown in FIG. 1, the surface of each of electrode for first conductive type 6 and electrode for second conductive type 7 is covered with migration suppressing layer 20. Accordingly, it is possible to prevent a metal such as silver forming electrode for first conductive type 6 and electrode for second conductive type 7 from precipitating by a migration phenomenon by an electric field caused by potential difference occurring between neighboring electrode for first conductive type 6 and electrode for second conductive type 7 during use of the solar cell module.

When a metal is contained in the material forming migration suppressing layer 20, a metal that forms migration suppressing layer 20 sometimes precipitates by an electric field between the surface of migration suppressing layer 20 covering electrode for first conductive type 6 and the surface of migration suppressing layer 20 covering electrode for second conductive type 7. However, since the tendency of occurrence of migration greatly differs among metal materials, it is possible to prevent migration from progressing by using a metal material (tin, palladium, gold, platinum, chromium, iron, nickel, lead or the like when the electrode is silver) that is less likely to cause migration compared with a metal such as silver forming electrode for first conductive type 6 and electrode for second conductive type 7 as migration suppressing layer 20.

Insulating member 16 is disposed between at least a part of the back surface of back electrode type solar cell 8 between neighboring electrode for first conductive type 6 and a metal for second conductive type 7, and at least a part of the surface of insulating base material 11 between neighboring wiring for first conductive type 12 and wiring for second conductive type 1. Therefore, even when metal precipitates due to migration, the movement can be stemmed by insulating member 16, and further, it is possible to prevent insulating property between neighboring electrode for first conductive type 6 and electrode for second conductive type 7 from deteriorating by insulating member 16. As a result, it is possible to suppress deterioration in characteristics of the solar cell module caused by migration more effectively in comparison with conventional cases.

Preferably, insulating member 16 is disposed so as to traverse the straight line connecting neighboring electrode for first conductive type 6 and electrode for second conductive type 7. Since migration is a phenomenon that metal precipitates and moves along an electric field, it is possible to stem the movement of the metal precipitated by migration by insulating member 16 by disposing insulating member 16 so as to traverse the straight line connecting neighboring electrode for first conductive type 6 and electrode for second conductive type 7.

In the above, while the constitution where each of lateral wall 6*a* and bottom face 6*b* of electrode for first conductive type 6, and lateral wall 7*a* and bottom face 7*b* of electrode for second conductive type 7 is formed with migration suppressing layer 20 has been described, only lateral wall 6*a* of electrode for first conductive type 6 and only lateral wall 7*a* of electrode for second conductive type 7 may be formed with migration suppressing layer 20 when bottom face 6*b* of electrode for first conductive type 6 and bottom face 7*b* of electrode for second conductive type 7 are covered with a conductive member such as a wiring as shown in FIG. 1 or FIG. 6.

Further, while migration suppressing layer 20 is preferably conductive so that electrode for first conductive type 6 of back electrode type solar cell 8 and wiring for first conductive type 12 of interconnection sheet 10 are electrically connected, and electrode for second conductive type 7 of back electrode type solar cell 8 and wiring for second conductive type 13 of interconnection sheet 10 are electrically connected, it is not necessarily conductive when the structure is such that bottom face 6b of electrode for first conductive type 6 and wiring for first conductive type 12 are in direct contact with each other, and bottom face 7b of electrode for second conductive type 7 and wiring for second conductive type 13 are in direct contact with each other.

It suffices that at least one of the surface of electrode for first conductive type 6 and the surface of electrode for second conductive type 7 is covered with migration suppressing layer 20, however, from the view point of preventing precipitation of metal by migration more effectively, it is preferred that both of the surface of electrode for first conductive type 6 and the surface of electrode for second conductive type 7 are covered with migration suppressing layer 20. When only the surface of electrode for first conductive type 6 is covered with migration suppressing layer 20, insulating member 16 is disposed to traverse the straight line connecting neighboring electrode for first conductive type 6 and electrode for second conductive type 7.

The concept of the back electrode type solar cell in the present invention embraces not only those having a constitution that both of the electrode for first conductive type and the electrode for second conductive type are formed only on one surface side (back surface side) of the semiconductor substrate as described above, but also any of so-called back contact type solar cells (a solar cell having a structure of deriving current from the back surface side opposite to the light-receiving surface of the solar cell) such as a MWT (Metal Wrap Through) cell (a solar cell having a constitution that part of an electrode is disposed in a through-hole provided in a semiconductor substrate).

Further, the concept of the solar cell with interconnection sheet attached in the present invention embraces not only the constitution that a plurality of solar cells are disposed on an interconnection sheet but also the constitution that a single solar cell is disposed on an interconnection sheet.

Embodiment 2

Figure 7:
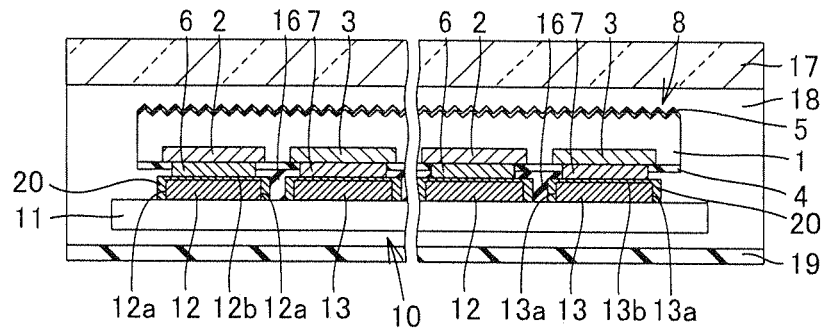
FIG. 7 is a schematic sectional view of another example of a solar cell module of the present invention.

FIG. 7 is a schematic sectional view of another example of a solar cell module of the present invention. The solar cell module having a constitution shown in FIG. 7 is characterized in that migration suppressing layer 20 is disposed to cover the surface (lateral wall 12a and top face 12b) of wiring for first conductive type 12 of interconnection sheet 10, and migration suppressing layer 20 is disposed to cover the surface (lateral wall 13a and top face 13b) of wiring for second conductive type 13 of interconnection sheet 10.

In the following, one example of a production method of a solar cell module having a constitution shown in FIG. 7 will be described. Back electrode type solar cell 8 that is used in the solar cell module having the constitution shown in FIG. 7 may be fabricated in a similar manner to Embodiment 1 except that migration suppressing layer 20 is not formed on each of the surface of electrode for first conductive type 6 and the surface of electrode for second conductive type 7 on the back surface of back electrode type solar cell 8.

Interconnection sheet 10 used in a solar cell module having a constitution shown in FIG. 7 may be fabricated, for example, as shown in schematic plan views of FIG. 8(a) to FIG. 8(d).

Figure 8:
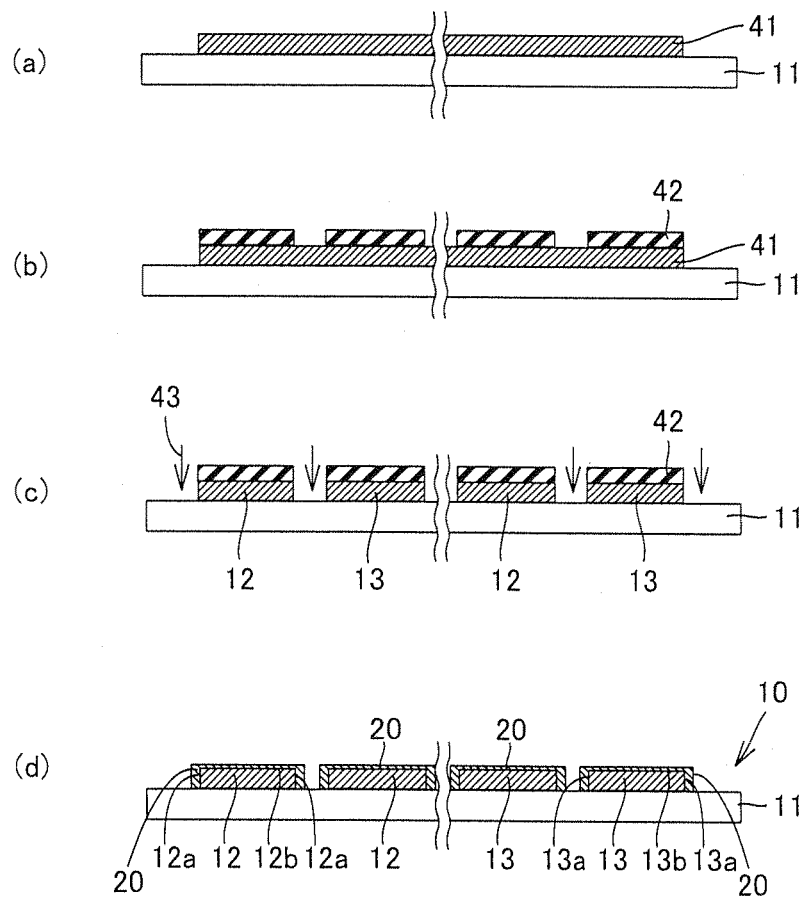
FIGS. 8(a) to 8(d) are schematic sectional views illustrating another example of a production method of an interconnection sheet used in a solar cell module of the present invention.

First, as shown in FIG. 8(a), after forming conductive layer 41 on the surface of insulating base material 11, resist pattern 42 is formed on conductive layer 41 on the surface of insulating base material 11 as shown in FIG. 8(b).

Next, as shown in FIG. 8(c), patterning of conductive layer 41 is conducted, by removing conductive layer 41 in the direction of arrow 43 in the site exposed from resist pattern 42, and wiring for first conductive type 12 and wiring for second conductive type 13 are formed from the remainder of conductive layer 41.

Then, as shown in FIG. 8(d), after removing all of resist pattern 42 from the surface of wiring for first conductive type 12 and the surface of wiring for second conductive type 13, migration suppressing layer 20 is formed to cover the surface (lateral wall 12a and top face 12b) of wiring for first conductive type 12 of interconnection sheet 10 and migration suppressing layer 20 is formed to cover the surface (lateral wall 13a and top face 13b) of interconnection sheet 10 of wiring for second conductive type 13, whereby interconnection sheet 10 is fabricated.

Figure 9:
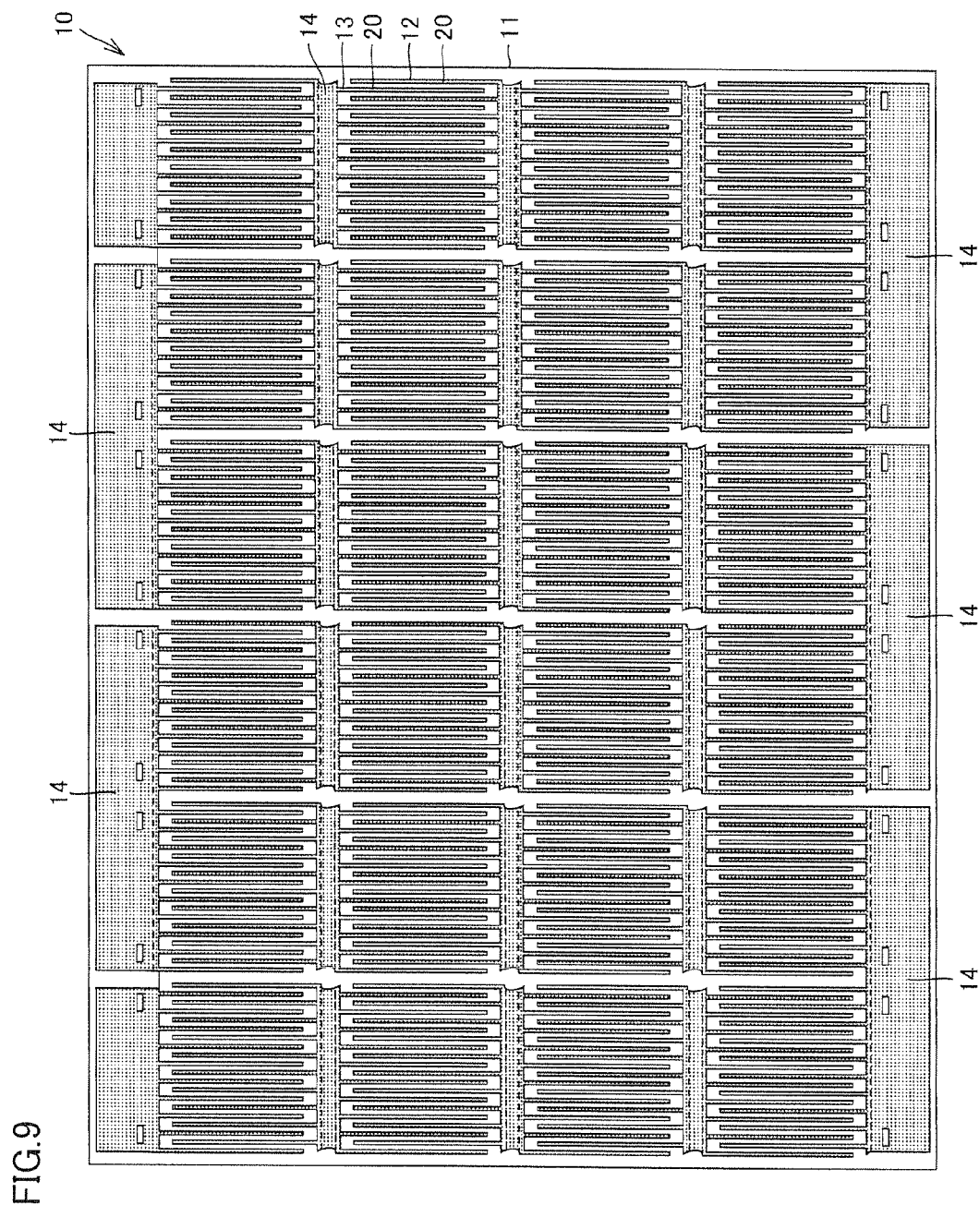
FIG. 9 is a schematic plan view of another example of an interconnection sheet used in a solar cell module of the present invention.

FIG. 9 is a schematic plan view of one example of surface of interconnection sheet 10 fabricated in the manner as described above. Here, surface of each of wiring for first conductive type 12 and wiring for second conductive type 13 formed into strips on the surface of insulating substrate 11 of interconnection sheet 10 is covered with migration suppressing layer 20.

Further, the solar cell with interconnection sheet attached in the present embodiment may be fabricated in the following manner.

Figure 10:
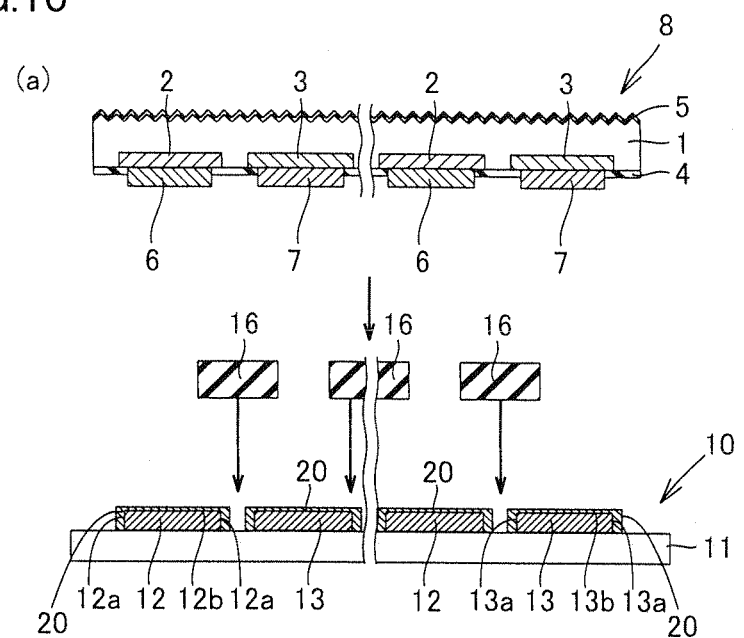
FIGS. 10(a) and 10(b) are schematic sectional views illustrating another example of a production method of a solar cell with interconnection sheet attached of the present invention.
Figure 10:
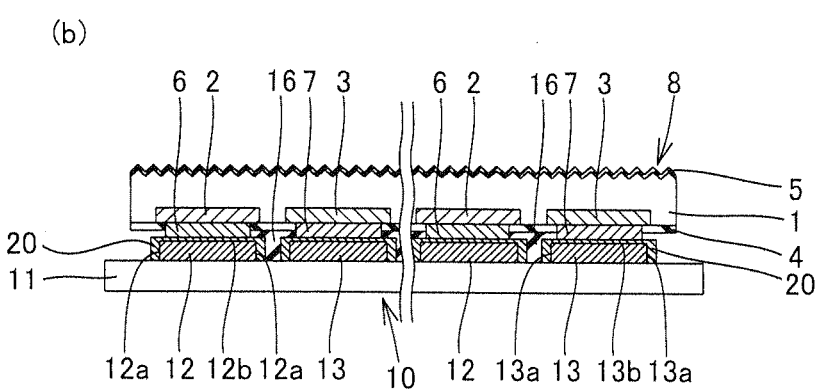

First, as shown in a schematic sectional view of FIG. 10(a), after applying an insulating adhesive material serving as insulating member 16 on the surface of interconnection sheet 10 fabricated in the manner as described above, electrode for first conductive type 6 of back electrode type solar cell 8 fabricated in the manner as described above is disposed on wiring for first conductive type 12 of interconnection sheet 10, and electrode for second conductive type 7 of back electrode type solar cell 8 is disposed on wiring for second conductive type 13 of interconnection sheet 10.

As a result, as shown in a schematic sectional view of FIG. 10(b), a solar cell with interconnection sheet attached having such a constitution that back electrode type solar cell 8 and interconnection sheet 10 are adhered by insulating member 16 while electrode for first conductive type 6 of back electrode type solar cell 8 and wiring for first conductive type 12 of interconnection sheet 10 are electrically connected with migration suppressing layer 20 interposed therebetween, and electrode for second conductive type 7 of back electrode type solar cell 8 and wiring for second conductive type 13 of interconnection sheet 10 are electrically connected with migration suppressing layer 20 interposed therebetween is formed.

Then, as shown in FIG. 7, by sealing the solar cell with interconnection sheet attached fabricated in the manner as described above in sealant 18 such as ethylene vinyl acetate between transparent substrate 17 such as a glass substrate and back film 19 such as a polyester film, one example of a solar cell module of the present invention is fabricated.

At this time, at least a part of the back surface of back electrode type solar cell 8 between neighboring electrode for first conductive type 6 and electrode for second conductive type 7, and at least a part of the surface of insulating base material 11 between neighboring wiring for first conductive type 12 and wiring for second conductive type 13 are joined by insulating member 16.

As described above, in the solar cell module having a constitution shown in FIG. 7, migration suppressing layer 20 is formed to cover the surface (lateral wall 12a and top face 12b) of wiring for first conductive type 12 of interconnection sheet 10, and migration suppressing layer 20 is formed to cover the surface (lateral wall 13a and top face 13b) of wiring for second conductive type 13 of interconnection sheet 10. Then, at least a part of the back surface of back electrode type solar cell 8 between neighboring electrode for first conductive type 6 and electrode for second conductive type 7, and at least a part of the surface of insulating base material 11 between neighboring wiring for first conductive type 12 and wiring for second conductive type 13 are joined by insulating member 16.

Therefore, in the solar cell module having a constitution shown in FIG. 7, the surface of each of wiring for first conductive type 12 and wiring for second conductive type 13 is covered with migration suppressing layer 20. Accordingly, it is possible to prevent metal such as copper forming wiring for first conductive type 12 and wiring for second conductive type 13 from precipitating due to a migration phenomenon caused by potential difference occurring between neighboring wiring for first conductive type 12 and wiring for second conductive type 13 during use of the solar cell module.

When metal is contained in a material forming migration suppressing layer 20, the metal forming migration suppressing layer 20 can precipitate by an electric field between the surface of migration suppressing layer 20 covering wiring for first conductive type 12 and the surface of migration suppressing layer 20 covering wiring for second conductive type 13. However, since likelihood of occurrence of migration greatly differs among metal materials, it is possible to prevent migration from progressing by using a metal material (tin, palladium, gold, platinum, chromium, iron, nickel, lead or the like when the wiring is copper) that is less susceptible to migration compared with metal such as copper forming wiring for first conductive type 12 and wiring for second conductive type 13 as migration suppressing layer 20.

Between at least a part of the back surface of back electrode type solar cell 8 between neighboring electrode for first conductive type 6 and metal for second conductive type 7, and at least a part of the surface of insulating base material 11 between neighboring wiring for first conductive type 12 and wiring for second conductive type 13, insulating member 16 is disposed. Therefore, even when metal precipitates due to migration, the movement can be stemmed by insulating member 16, and further, it is possible to prevent insulating property between neighboring wiring for first conductive type 12 and wiring for second conductive type 13 from deteriorating by insulating member 16. As a result, it is possible to suppress deterioration in characteristics of the solar cell module caused by migration more effectively in comparison with conventional cases.

Preferably, insulating member 16 is disposed to traverse the straight line connecting neighboring wiring for first conductive type 12 and wiring for second conductive type 13. Since migration is a phenomenon that metal precipitates and moves along an electric field, it is possible to stem the movement of the metal precipitated by migration by insulating member 16 by disposing insulating member 16 to traverse the straight line connecting neighboring wiring for first conductive type 12 and wiring for second conductive type 13.

In the above, while the constitution where each of lateral wall 12a and top face 12b of wiring for first conductive type 12, and lateral wall 13a and top face 13b of wiring for second conductive type 13 is formed with migration suppressing layer 20 has been described, only lateral wall 12a of wiring for first conductive type 12 and only lateral wall 13a of wiring for second conductive type 13 may be formed with migration suppressing layer 20.

It suffices that at least either one of the surface of wiring for first conductive type 12 and the surface of wiring for second conductive type 13 is covered with migration suppressing layer 20, however, from the view point of preventing precipitation of metal by migration more effectively, it is preferred that both of the surface of wiring for first conductive type 12 and the surface of wiring for second conductive type 13 are covered with migration suppressing layer 20. When only the surface of wiring for first conductive type 12 is covered with migration suppressing layer 20, insulating member 16 is disposed to traverse the straight line connecting neighboring wiring for first conductive type 12 and wiring for second conductive type 13.

Other descriptions than those described above in this embodiment are similar to those in Embodiment 1, and the descriptions are omitted herein.

Embodiment 3

Figure 11:
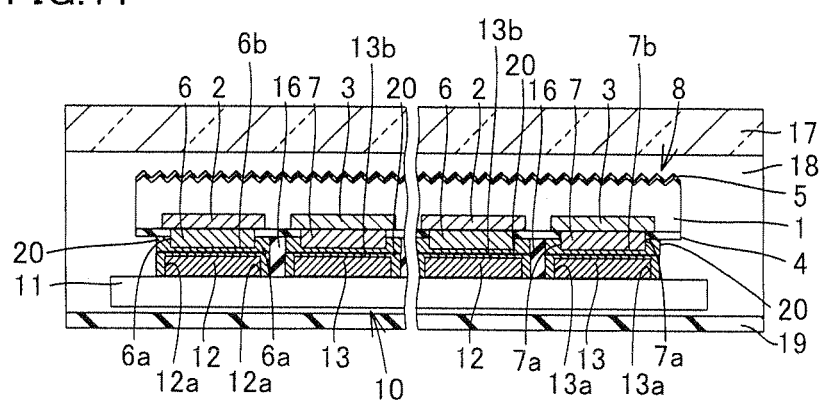
FIG. 11 is a schematic sectional view of another example of a solar cell module of the present invention.
Figure 12:
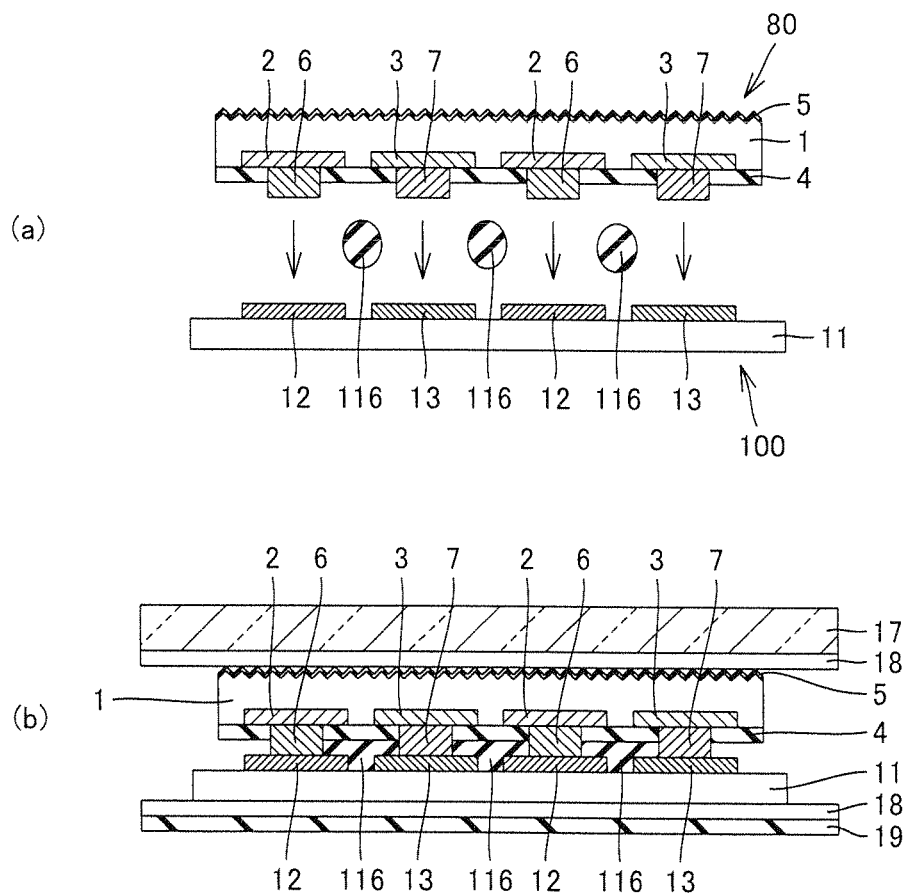
FIGS. 12(a) and 12(b) are schematic sectional views illustrating one example of a method of making a solar cell module by sealing a solar cell with interconnection sheet attached in a sealant.

FIG. 11 is a schematic sectional view of other example of a solar cell module of the present invention. The solar cell module having a constitution shown in FIG. 11 is characterized in that migration suppressing layer 20 is formed to cover each of the surface (lateral wall 6a and bottom face 6b) of electrode for first conductive type 6 of back electrode type solar cell 8 and the surface (lateral wall 7a and bottom face 7b) of electrode for second conductive type 7, and migration suppressing layer 20 is disposed to cover the surface (lateral wall 12a and top face 12b) of wiring for first conductive type 12 and the surface (lateral wall 13a and top face 13b) of wiring for second conductive type 13 of interconnection sheet 10.

Therefore, in the solar cell module having the constitution shown in FIG. 11, the surface of each of electrode for first conductive type 6 and electrode for second conductive type 7 is covered with migration suppressing layer 20, and the surface of each of wiring for first conductive type 12 and wiring for second conductive type 13 is covered with migration suppressing layer 20. Accordingly, it is possible to prevent a metal such as silver forming electrode for first conductive type 6 and electrode for second conductive type 7, and a metal such as copper forming wiring for first conductive type 12 and wiring for second conductive type 13, from precipitating due to a migration phenomenon caused by potential difference occurring between neighboring electrode for first conductive type 6 and electrode for second conductive type 7 and/or a migration phenomenon caused by potential difference occurring between neighboring wiring for first conductive type 12 and wiring for second conductive type 13 during use of the solar cell module. Accordingly, it is possible to suppress deterioration in characteristics of the solar cell module caused by precipitation and movement of the metal forming electrode for first conductive type 6 and electrode for second conductive type 7, and the metal forming wiring for first conductive type 12 and wiring for second conductive type 13 more effectively compared with conventional cases.

Further, between at least a part of the back surface of back electrode type solar cell 8 between neighboring electrode for first conductive type 6 and metal for second conductive type 7, and at least a part of the surface of insulating base material 11 between neighboring wiring for first conductive type 12 and wiring for second conductive type 13, insulating member 16 is disposed. Therefore, even when metal precipitates due to migration, the movement can be stemmed by insulating member 16, and further, it is possible to prevent insulating property between neighboring electrode for first conductive type 6 and electrode for second conductive type 7 and/or between neighboring wiring for first conductive type 12 and wiring for second conductive type 13 from deteriorating by insulating member 16. As a result, it is possible to suppress deterioration in characteristics of the solar cell module caused by migration more effectively in comparison with conventional cases.

Preferably, insulating member 16 is disposed to traverse the straight line connecting neighboring electrode for first conductive type 6 and metal for second conductive type 7, and is disposed to traverse the straight line connecting neighboring wiring for first conductive type 12 and wiring for second conductive type 13. Since migration is a phenomenon that metal precipitates and migrates along an electric field, it is possible to effectively stem the movement of the metal precipitated by migration by insulating member 16, by disposing insulating member 16 to traverse the straight line connecting neighboring electrode for first conductive type 6 and metal for second conductive type 7, and to traverse the straight line connecting neighboring wiring for first conductive type 12 and wiring for second conductive type 13.

Other descriptions than those described above in this embodiment are similar to those in Embodiment 1 and Embodiment 2, and the descriptions are omitted herein.

It is to be noted that embodiments disclosed herein are given for exemplification rather than for limitation in every aspect. The scope of the present invention is defined by claims rather than by the foregoing description, and any modifications within the range of equivalent meanings with such claims are intended to be involved.

INDUSTRIAL APPLICABILITY

The present invention may be applied in a solar cell, a solar cell with interconnection sheet attached and a solar cell module.

REFERENCE SIGNS LIST 1 semiconductor substrate, 1a slice damage, 2 first conductive type impurity diffusion area, 3 second conductive type impurity diffusion area, 4 passivation film, 4a, 4b contact hole, 5 antireflection film, 6 electrode for first conductive type, 6a, 6b bottom face, 7 electrode for second conductive type, 7a lateral wall, 7b bottom face, 8, 80 back electrode type solar cell, 10, 100 interconnection sheet, 11 insulating base material, 12 wiring for first conductive type, 12a lateral wall, 12b top face, 13 wiring for second conductive type, 13a lateral wall, 13b top face, 14 wiring for connection, 16 insulating member, 17 transparent substrate, 18 sealant, 19 back film, 20 migration suppressing layer, 41 conductive layer, 42 resist pattern, 43 arrow, 116 insulating adhesive

The invention claimed is:

1. A solar cell comprising:
a semiconductor substrate;
a first conductive type impurity diffusion area and a second conductive type impurity diffusion area formed on one surface side of said semiconductor substrate;
an electrode for first conductive type disposed on said first conductive type impurity diffusion area; and
an electrode for second conductive type disposed on said second conductive type impurity diffusion area,
wherein a surface of said electrode for first conductive type is covered with a migration suppressing layer for preventing a metal forming said electrode for first conductive type from precipitating, and
a surface of said migration suppressing layer covering said electrode for first conductive type and a surface of said electrode for first conductive type is directly covered with an insulating member.

2. The solar cell according to claim 1, wherein each of said migration suppressing layer and said insulating member is disposed to traverse a straight line connecting neighboring said electrode for first conductive type and said electrode for second conductive type.

3. A solar cell with interconnection sheet attached comprising:
a solar cell; and
an interconnection sheet,
wherein said solar cell has a semiconductor substrate, a first conductive type impurity diffusion area and a second conductive type impurity diffusion area formed on one surface side of said semiconductor substrate, an electrode for first conductive type disposed on said first conductive type impurity diffusion area, and an electrode for second conductive type disposed on said second conductive type impurity diffusion area,
said interconnection sheet has an insulating base material, a wiring for first conductive type and a wiring for second conductive type disposed on said insulating base material,
said electrode for first conductive type of said solar cell is disposed to be electrically connected with said wiring for first conductive type of said interconnection sheet,
said electrode for second conductive type of said solar cell is disposed to be electrically connected with said wiring for second conductive type of said interconnection sheet,
a surface of said electrode for first conductive type is covered with a migration suppressing layer for preventing a metal forming said electrode for first conductive type from precipitating, and
a surface of said electrode for first conductive type is directly covered with an insulating member.

4. The solar cell with interconnection sheet attached according to claim 3, wherein each of said migration suppressing layer and said insulating member is disposed to traverse the straight line connecting neighboring said electrode for first conductive type and said electrode for second conductive type.

5. A solar cell with interconnection sheet attached comprising:
a solar cell; and
an interconnection sheet,
wherein said solar cell has a semiconductor substrate, a first conductive type impurity diffusion area and a second conductive type impurity diffusion area formed on one surface side of said semiconductor substrate, an electrode for first conductive type disposed on said first conductive type impurity diffusion area, and an electrode for second conductive type disposed on said second conductive type impurity diffusion area,
said interconnection sheet has an insulating base material, a wiring for first conductive type and a wiring for second conductive type disposed on said insulating base material,
said electrode for first conductive type of said solar cell is disposed to be electrically connected with said wiring for first conductive type of said interconnection sheet,
said electrode for second conductive type of said solar cell is disposed to be electrically connected with said wiring for second conductive type of said interconnection sheet,
a surface of said wiring for first conductive type for preventing metal forming said wiring for first conductive type from precipitating, and a surface of said wiring for first conductive type is directly covered with an insulating member.

6. The solar cell with interconnection sheet attached according to claim 5, wherein each of said migration suppressing layer and said insulating member is disposed to traverse the straight line connecting neighboring said wiring for first conductive type and said wiring for second conductive type.

7. A solar cell module comprising said solar cell of the solar cell with interconnection sheet attached according to claim 3 sealed in a sealant.

8. The solar cell according to claim 1, wherein a surface of said electrode for second conductive type is covered with a second migration suppressing layer for preventing a metal forming said electrode for second conductive type from precipitating, and between said electrode for first conductive type and said electrode for second conductive type neighboring to said electrode for first conductive type, from said electrode for first conductive type side, said migration suppressing layer, said insulating member and said second migration suppressing layer are in contact with a surface of said solar cell.

9. The solar cell with interconnection sheet attached according to claim 3, wherein a surface of said electrode for second conductive type is covered with a second migration suppressing layer for preventing a metal forming said electrode for second conductive type from precipitating, and between said electrode for first conductive type and said electrode for second conductive type neighboring to said electrode for first conductive type, from said electrode for first conductive type side, said migration suppressing layer, said insulating member and said second migration suppressing layer are in contact with a surface of said solar cell.

10. The solar cell with interconnection sheet attached according to claim 5, wherein a surface of said electrode for second conductive type is covered with a second migration suppressing layer for preventing a metal forming said electrode for second conductive type from precipitating, and between said electrode for first conductive type and said electrode for second conductive type neighboring to said electrode for first conductive type, from said electrode for first conductive type side, said migration suppressing layer, said insulating member and said second migration suppressing layer are in contact with a surface of said solar cell.

11. A solar cell module comprising said solar cell of the solar cell with interconnection sheet attached according to claim 5 sealed in a sealant.

* * * * *